(12) United States Patent
    Shang

(10) Patent No.: US 10,983,618 B2
(45) Date of Patent: Apr. 20, 2021

(54) DISPLAY SUBSTRATE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventor: Jianxing Shang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 78 days.

(21) Appl. No.: 16/303,310

(22) PCT Filed: Apr. 18, 2018

(86) PCT No.: PCT/CN2018/083555
§ 371 (c)(1),
(2) Date: Nov. 20, 2018

(87) PCT Pub. No.: WO2018/192523
PCT Pub. Date: Oct. 25, 2018

(65) Prior Publication Data
US 2019/0212855 A1 Jul. 11, 2019
US 2020/0225791 A9 Jul. 16, 2020

(30) Foreign Application Priority Data
Apr. 21, 2017 (CN) .......................... 201710264273.0

(51) Int. Cl.
*G06F 3/041* (2006.01)
*H01L 27/12* (2006.01)
*G02F 1/1345* (2006.01)
*G02F 1/1362* (2006.01)
(Continued)

(52) U.S. Cl.
CPC .......... *G06F 3/0412* (2013.01); *G02F 1/1345* (2013.01); *G02F 1/136286* (2013.01);
(Continued)

(58) Field of Classification Search
CPC ............... G06F 3/0412; G06F 3/04164; G02F 1/136286; G02F 1/13338; G02F 1/1368;
(Continued)

(56) References Cited

U.S. PATENT DOCUMENTS 9,268,181 B2    2/2016  Nagami
2016/0291754 A1* 10/2016  Jin .................. G06F 3/0412
(Continued)

FOREIGN PATENT DOCUMENTS

CN    102981326 A    3/2013
CN    104699349 A    6/2015
(Continued)

OTHER PUBLICATIONS

PCT International Search Report, Application No. PCT/CN2018/083555, dated Jul. 9, 2018, 6 pages: with English translation.
(Continued)

Primary Examiner — Muhammad N Edun
(74) Attorney, Agent, or Firm — Armstrong Teasdale LLP

(57) ABSTRACT

The embodiment of the disclosure provides a display substrate and a display device. The display substrate includes data signal lines located in a display area of the display substrate, and fanout lines in a fanout area adjacent the display area of the display substrate and respectively connected in one-to-one correspondence with the data signal lines, wherein the data signal fanout lines include first fanout lines disposed in the same layer with a touch electrode of the display substrate.

18 Claims, 6 Drawing Sheets

(51) Int. Cl.
*G02F 1/1368* (2006.01)
*G02F 1/1333* (2006.01)

(52) U.S. Cl.
CPC ...... *G06F 3/04164* (2019.05); *H01L 27/1244* (2013.01); *G02F 1/1368* (2013.01); *G02F 1/13338* (2013.01); *G02F 1/13629* (2021.01)

(58) Field of Classification Search
CPC ......... G02F 1/1345; G02F 2001/13629; H01L 27/1244; H01L 27/124; G09F 9/00
See application file for complete search history.

(56) References Cited

U.S. PATENT DOCUMENTS

2016/0299599 A1* 10/2016 Kang ................ G06F 3/044
2016/0306475 A1* 10/2016 Cho ................. G06F 3/044
2017/0185194 A1* 6/2017 Kim ................. G06F 3/0412
2018/0197891 A1* 7/2018 Yang ................ G02F 1/1345

FOREIGN PATENT DOCUMENTS

| CN | 105468202 A | 4/2016 |
|---|---|---|
| CN | 106444182 A | 2/2017 |
| CN | 107037646 A | 8/2017 |

OTHER PUBLICATIONS

PCT Written Opinion, Application No. PCT/CN2018/083555, dated Jul. 9, 2018, 6 pages.: with English translation of relevant part.
China Fourth Office Action, Application No. 201710264273.0, dated Jan. 18, 2021, 14 pps.: with English translation.

* cited by examiner

DISPLAY SUBSTRATE AND DISPLAY DEVICE

CROSS REFERENCE TO RELATED APPLICATIONS

This patent application is a National Stage Entry of PCT/CN2018/083555 filed on Apr. 18, 2018, which claims the benefit and priority of Chinese Patent Application No. 201710264273.0 filed on Apr. 21, 2017, the disclosures of which are incorporated herein by reference in their entirety as part of the present application.

BACKGROUND

The present disclosure relates to a field of display technologies, and in particular, to a display substrate and a display device.

At present, in a high definition Full In Cell (HD FIC) touch screen, a fanout area is needed where signal lines of a display area is led out by lead-out wires. Since the fanout area is smaller than the display area and a number of signal lines to be lead out is large, the lines is required to be inclined when led out from the display area.

BRIEF DESCRIPTION

An aspect of the present disclosure provides a display substrate. The display substrate includes data signal lines located in a display area of the display substrate, and data signals fanout line in a fanout area adjacent the display area of the display substrate and respectively connected in one-to-one correspondence with the data signal lines. The data signal fanout lines include a first fanout lines disposed in the same layer with a touch electrode of the display substrate.

In an embodiment, the data signal fanout line further includes a second fanout lines and a third fanout lines. The second fanout lines are disposed in the same layer as a source/drain electrode of the display substrate. The third fanout lines are disposed in the same layer with a gate electrode of the display substrate.

In an embodiment, the display substrate further includes bonding lines in the bonding area. The bonding area is located on a side of the fanout area far away from the display area. The bonding lines are connected in one-to-one correspondence with the data signal fanout lines.

In an embodiment, the bonding line includes a first bonding lines disposed in the same layer as the source/drain electrode and second bonding lines disposed in the same layer as the gate electrode. The first fanout lines are connected to at least one of the first bonding lines and the second bonding lines.

In an embodiment, the second fanout lines are connected to the first bonding lines and the third fanout lines are connected to the second bond lines.

In an embodiment, a number of the first fanout lines connected to the first bond lines is equal to a number of the first fanout lines connected to the second bond lines.

In an embodiment, the display substrate further includes a first insulating layer between the source/drain electrode and the touch electrode, a second insulating layer covering the touch electrode and the first insulating layer, a first hole penetrating the first insulating layer and the second insulating layer, and a second hole disposed in the second insulating layer. The first fanout line is connected to the data signal line through the first hole and the second hole.

In an embodiment, the display substrate further includes a third hole penetrating the first insulating layer and the second insulating layer, and a fourth hole disposed in the second insulating layer. The first fanout line is connected to the first bonding line through the third hole and the fourth hole.

In an embodiment, the display substrate further includes a third insulating layer between the source/drain electrode and the gate electrode, a fifth hole penetrating through the first insulating layer, the second insulating layer and the third insulating layer, and a sixth hole disposed in the second insulating layer. The first fanout line is connected to the second bonding line through the fifth hole and the sixth hole.

In an embodiment, the display substrate further includes touch signal lines disposed in the display area and in the same layer as the touch electrode, touch signal fanout lines located in the fanout area and respectively connected in one-to-one correspondence to the touch signal lines.

In an embodiment, the data signal fanout line and the touch signal fanout line are spaced apart from each other.

In an embodiment, an angle at which the first fanout line is inclined with respect to an extending direction of the data signal line is greater than a preset value, such that an interval between the data signal fanout line and an adjacent line is greater than an aperture of the holes in the second insulating layer.

In an embodiment, the touch signal line includes a dummy touch signal line, and the first fanout lines include a dummy touch signal fanout line corresponding to the dummy touch signal line.

Some embodiments of the present disclosure provide a display device including the display substrate according to the above.

DETAILED DESCRIPTION

In order to facilitate the understanding of the solution of the present disclosure, the basic idea of the solution of the present disclosure is first introduced: if the spacing between the lines of the fanout area is narrow, a short circuit is likely to occur. For example, in a structure, there are 2,160 data signal lines in the display area. In the solution, in the fanout area, there are 1,080 data signal fanout lines located in the same layer as the gate electrodes and 1,080 data signal fanout lines in the same layer as the source/drain electrodes to transmit the data signal. In this solution, the data signal fanout line of the fanout area located in the same layer as the gate electrode, and the data signal fanout line located in the same layer as the source/drain electrode are densely arranged. In the actual production process, after the thinning technique is used, there is still a problem of short-circuiting between the respective layer data signal fanout lines that are in the same layer as the gate electrode and in the same layer as the source/drain electrodes.

In order to reduce the setting density of the data signal fanout lines disposed in the same layer as the source/drain electrode and/or the data signal fanout lines disposed in the same layer as the gate electrode, the inventors consider setting a part of the data signal fanout lines in other conductive layers. In the process of implementing the present disclosure, the inventors have found that the lines disposed in the layer where the touch electrodes of the fanout area of the in-cell touch panel are located (referred to as "touch electrode layer") are relatively sparse, and some lines can be disposed in the layer where the touch electrode is located to transmit the data signal. The solution provided by the present disclosure will be described in more detail below with reference to the accompanying drawings and embodiments.

Figure 1A:
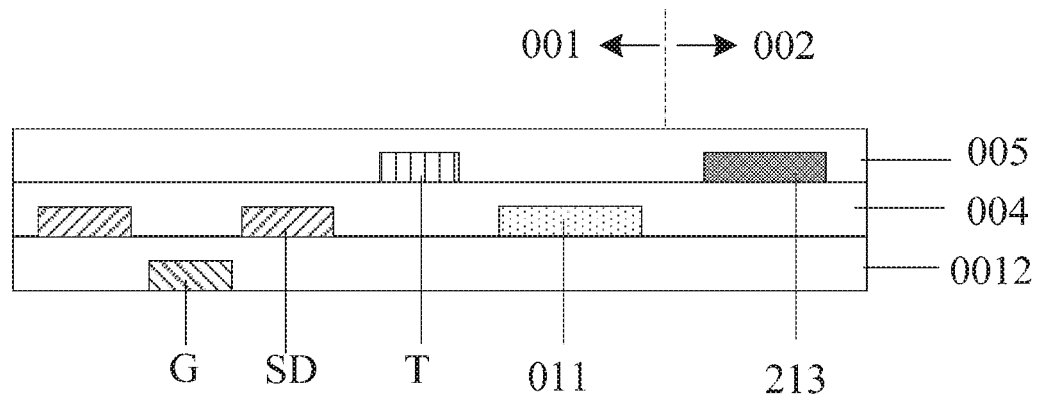
FIG. 1A is a schematic structural view of a display substrate according to an embodiment of the present disclosure.

An embodiment of the present disclosure provides a display substrate. As shown in FIG. 1A, the display substrate includes a display area 001 and a fanout area 002 adjacent the display area. The display area 001 includes a plurality of data signal lines 011 in the same layer as the source/drain electrode SD. The fanout area 002 includes a plurality of data signal fanout lines 021 (see FIG. 1B) connected in one-to-one correspondence with the respective data signal lines. The data signal fanout line includes a first fanout line 213 disposed in the same layer as the touch electrode T of the display substrate.

Figure 1B:
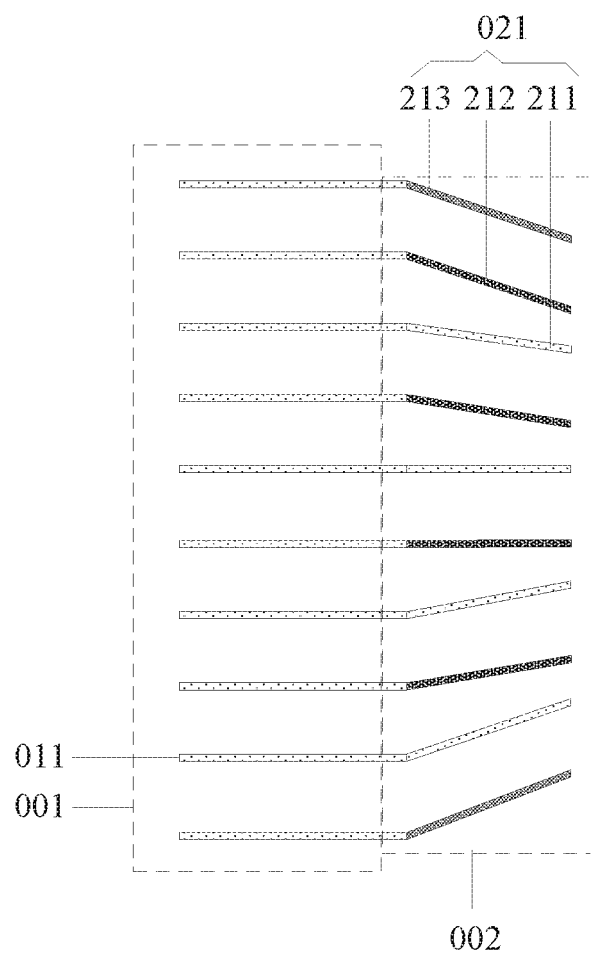
FIG. 1B is a schematic structural view of a display substrate according to an embodiment of the present disclosure.

In FIG. 1B, the data signal fanout lines of different layers are represented by different fills. As shown in FIG. 1B, in an embodiment, the data signal fanout line 021 further includes a second fanout line 211 disposed in the same layer as the source/drain electrode of the display substrate and a third fanout line 212 disposed in the same layer as the gate electrode of the display substrate.

It should be noted that, since the fanout area is relatively narrow with respect to the display area and the lines illustrated in the figure are inclined at a certain angle when extends to the fanout area with a trend of gathering toward the middle. The figure only shows the width and spacing of the lines and does not represent the true scale.

It should be noted that, in order to ensure the transmittance, generally, the area where the second fanout line 211 is located is overlapped with the area where the third fanout line 212 is located, which is not shown in the top view of FIG. 1B in order to reflect two layers.

In the embodiments of the present disclosure, data signal fanout lines (the first fanout line, the second fanout line, and the third fanout line) are provided in the layer where the touch electrode is located (i.e., the touch electrode layer), the layer where the gate electrode is located (i.e., the gate electrode layer), and the layer where the source/drain electrode are located (i.e., the source/drain electrode layer). Compared with the data signal fanout lines (the second fanout line and the third fanout line) are provided in the layer where the gate electrode is located and the source/drain electrode is located, the number of lines that are disposed in the same layer with a gate electrode and/or source/drain electrode layer (the second fanout lines and/or the third fanout lines), thereby a density of the data signal fanout line in the gate electrode layer and/or source/drain electrode layer (the second fanout line and/or the third fanout line) can be reduced. When the data signal is lead out from the display area, the distance between the obliquely arranged lines is increased, at least the risk of a short circuit between the data signal fanout lines (especially between the second fanout line and/or the third fanout line) is reduced.

During the specific implementation, the number of the first fanouts can be set according to actual needs, as long as the short circuit does not occur between the lines in the layer where the touch electrodes are located. Of course, since the number of data signal lines is constant, under certain conditions, the more the number of the first fanout lines, the fewer the number of the second fanout lines and the third fanout lines, and the more favorable it is to reduce the short circuit risk between lines. As the number of third lines increases, it is needed to appropriately reduce the width of the lines.

Generally, the display substrate further includes a bonding area on a side of the fanout region away from the display region, such as an integrated circuit hot bonding (i.e., IC bonding) region. In the bonding area, the lines are led out according to different layers and signals. The touch signal lines disposed in the same layer with a touch electrode are led out in a touch IC layer (not shown). The signal line disposed in the same layer with the source/drain electrode are led out in the source/drain electrode layer integrated circuit (SD IC) region. The data signal lines disposed in the same layer with the gate electrode are led out in the gate electrode layer integrated circuit (Gate IC) region. Based on this, it is needed to connect the first fanout line (the data signal fanout line provided in the same layer as the touch electrode) 213 to the bond line disposed in the same layer as the source/drain electrode (for example, data signal IC bonding line) or to the bond lines in the same layer as the gate electrode (e.g., data signal IC bonding line).

Figure 2:
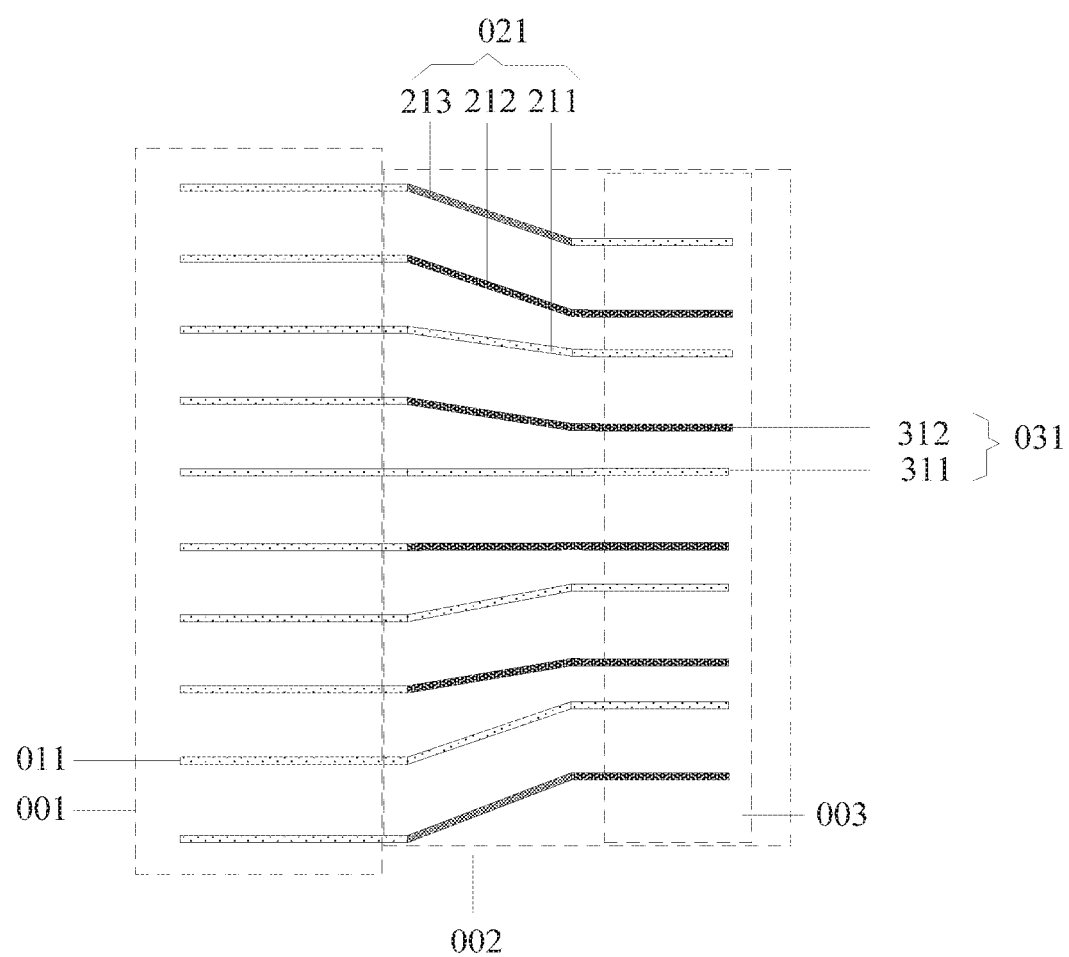
FIG. 2 is a schematic structural view of a display substrate according to an embodiment of the present disclosure.

As shown in FIG. 2, in the display substrate provided by the embodiment of the present disclosure, the fanout area includes a bonding area located on a side of the fanout area away from the display area (for example, an integrated circuit hot bonding area). The bonding area 003 includes a plurality of bonding lines 031 which are respectively connected to the fanout lines 021 in one-to-one correspondence.

Further, in FIG. 2, the bonding lines of the different film layers are still represented by different fillings. For example, the bonding line 031 may include a first bonding line 311 disposed in the same layer as the source/drain electrode and a second bonding line 312 disposed in the same layer as the gate electrode.

In an embodiment, the second fanout line 211 is connected to the first bonding line 311. The third fanout line 212 may be connected to the second line 312. The first fanout line 213 may be connected to at least one of a first bonding line 311 and a second bonding line 312. Illustrated in the figure is the case where the first fanout lines 213 are connected to the first bonding lines 311 and the second bonding lines 312, respectively. In the implementation, the number of the first fanouts assigned to the first bonding lines and the number of the first fanouts assigned to the second bonding lines may also be set according to actual needs. If the number of distributions is larger, the sparser the data signal fanout line disposed in the corresponding layer in the fanout area is. Thus, the risk of short-circuit is reduced when the data signal is led out from the display area. In a specific implementation, in an embodiment, the number of the first fanout lines connected to the first bonding lines is equal to the number of the first fanout lines connected to the second bonding line. In this way, the first fanout lines are evenly distributed to the first bonding lines and the second bonding lines. Therefore, the number of lines in the layer where the source/drain electrode is located and the number of lines in the layer where the gate electrode is located is reduced in the fanout region where lines are obliquely wired and the short circuit problem is improved.

Since the layer where the touch electrode is located is different from the layer where the source/drain electrode are located and the layer where the gate electrode is located, in the specific implementation, it is necessary to provide a connection hole to realize the connection between the different layers. The following is an example of a specific structure.

In an embodiment, the display substrate provided by the embodiment of the present disclosure further includes a first insulating layer between the source/drain electrode and the touch electrode, and a second insulating layer covering the touch electrode layer and the first insulating layer.

Figure 3:
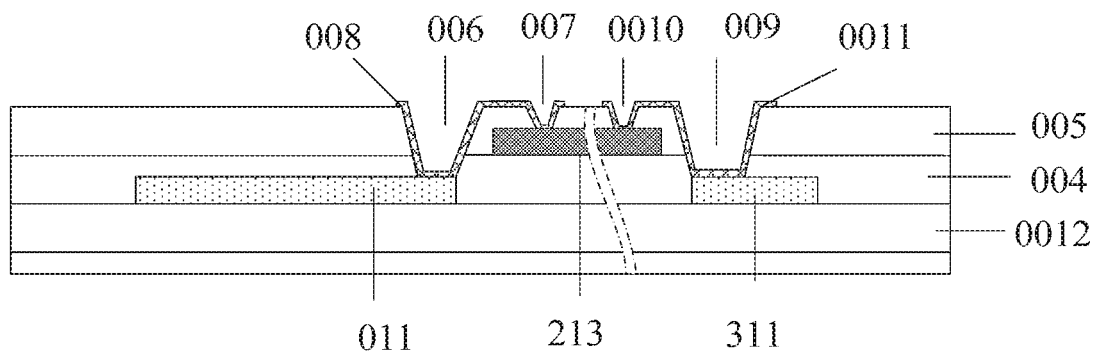
FIG. 3 is a schematic structural view of a display substrate according to an embodiment of the present disclosure.

As shown in FIG. 3, the first fanout line 213 is connected to, by a first connection hole 006 penetrating the first insulating layer 004 and the second insulating layer 005, a second connection hole 007 in the second insulating layer and the first connection line 008, to the data signal line 011.

In the figure, the left side of the dotted line is the end of the first fanout line 213 near the display area, and the right side is the end near the land.

In an embodiment, as shown in FIG. 3, the first fanout line 213 is connected, by a third connection hole 009 penetrating the first insulating layer 004 and the second insulating layer 005, a fourth connection hole 0010 in the second insulating layer 005, and a second connection line 0011, to the first bonding line 311.

Figure 4:
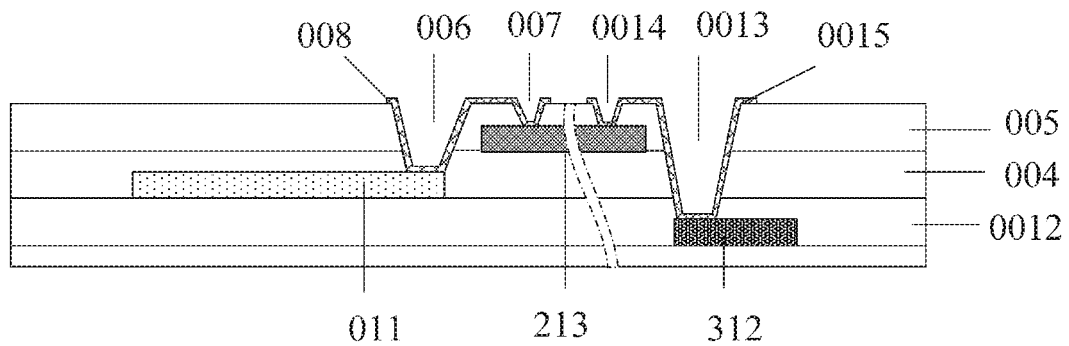
FIG. 4 is a schematic structural view of a display substrate according to an embodiment of the present disclosure.

In a specific embodiment, in an embodiment, as shown in FIG. 4, the display substrate provided by the embodiment of the present disclosure further includes a third insulating layer 0012 between the source/drain electrode and the gate electrode. The first fanout line 213 is connected, by a fifth connection hole 0013 penetrating through the first insulating layer 004, the second insulating layer 005 and the third insulating layer 0012, a sixth connection hole 0014 in the second insulating layer 005, and a third connection line 0015, to the second bonding line 312.

Figure 5:
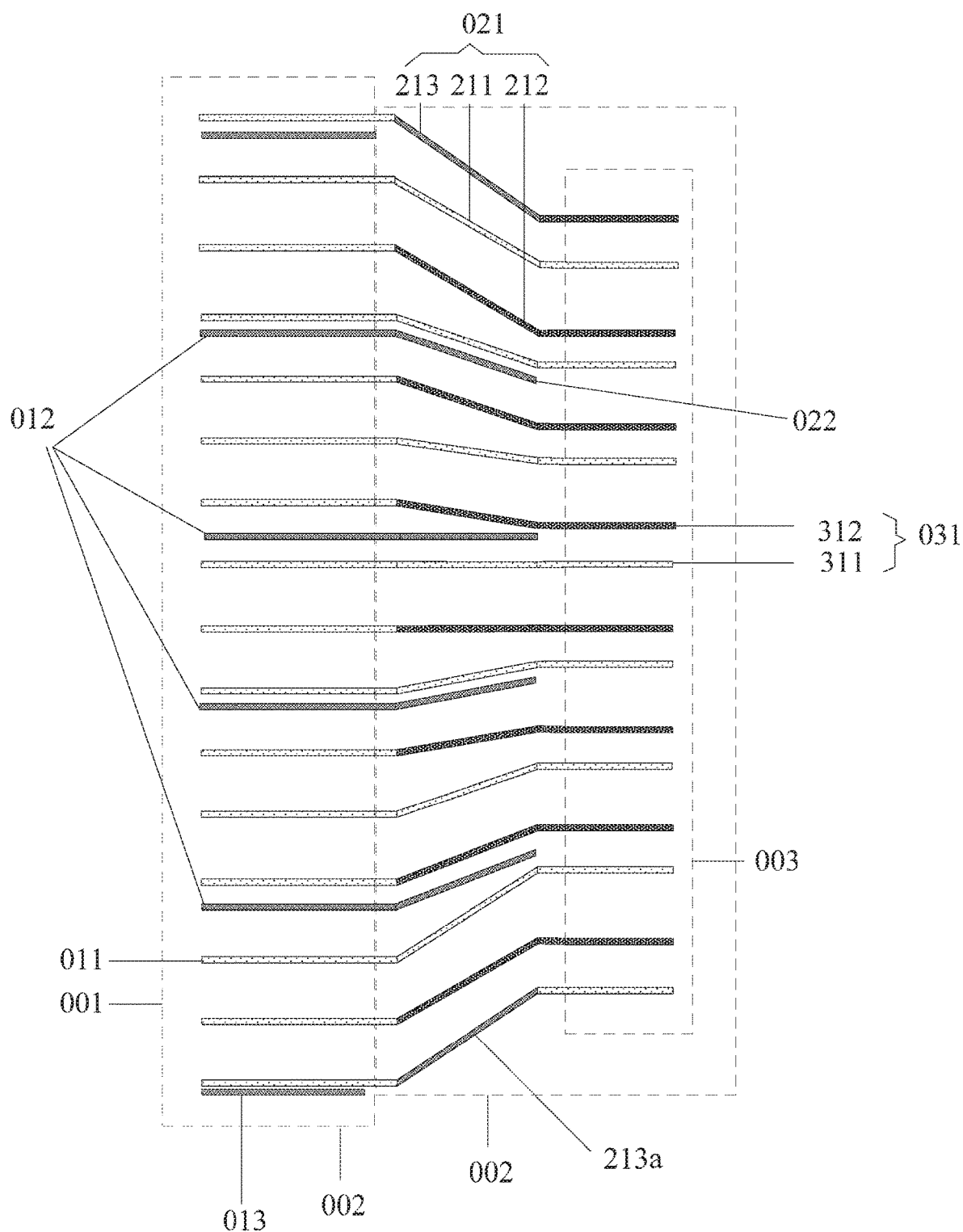
FIG. 5 is a schematic structural view of a display substrate according to an embodiment of the present disclosure.

In specific implementations, the first fanout 213 may be disposed in a plurality of manners. In an embodiment, as shown in FIG. 5, in an embodiment, the display substrate further includes a plurality of touch signal lines 012 which are in the display area and are disposed in the same layer as the touch electrode. The fanout area further includes a plurality of touch signal fanout lines 022 respectively connected to the touch signal lines. The first fanout line 213 and the touch signal fanout line 022 are set apart from each other.

Specifically, a touch signal fanout line 022 can be set every predetermined number of data signal fanout lines 021. In FIG. 5, an example is shown in which a touch signal fanout line 022 is set every four fanout lines 021.

In a specific implementation, as shown in FIG. 5, the touch signal line 012 includes a dummy touch signal line 013, and the first fanout line 213 includes a dummy touch signal fanout line 213a corresponding to the dummy touch signal line. In this way, minor modifications are made based on the original structure, and the design is simple.

Based on this, the number of first fanout lines can be equal to the number of dummy touch signal lines.

For example, in an HD FIC display structure, the display area is provided with 2160 data signal lines, 576 touch signal lines, and 144 dummy touch signal lines. One dummy touch signal line is set every four touch signal lines. When the data signal is led out from the fanout area, 2160 lines need to be arranged obliquely to lead 2160 data signal lines out. In this case, in the layer where the touch electrodes are located, in addition to the touch signal fanout lines connected in one-to-one connection with the 576 touch signal lines, 144 data signal fanout lines are disposed at positions corresponding to the extension lines of the fanout area of the 144 dummy touch signal lines. Thus, there may be only 1008 data signal fanout lines in the layer where the source/drain electrode are located and 1008 data signal fanout lines in the layer where the gate electrode are located. Therefore, the wiring density can be reduced, the interval between the lines can be increased, and the risk of short circuit can be reduced.

In the bonding area (for example, integrated circuit hot bonding area), the SD IC region is provided with 1080 first bonding lines disposed in the same layer as the source/drain electrodes, the Gate IC region is provided with 1080 second bonding lines disposed in the same layer as the gate electrodes, and the touch IC region is provided with 576 touch signals.

When the data signal fanout line reaches the bonding area, the 1008 second fanout lines are directly connected with the 1008 first bonding lines, and the 1008 third fanout lines are directly connected with the 1008 second bonding lines. Lines can be connected one by one. Among the 144 first fanout lines, 72 odd-numbered first fanout lines are connected in one-to-one correspondence with 72 first bonding lines (or second bonding lines), and 72 even-numbered first fanout lines are connected in one-to-one correspondence with 72 second bonding lines (or first bonding lines). Finally, the SD IC region of the bonding area leads out 1080 data signal integrated circuit bonding lines, the Gate IC region leads out 1080 data signal integrated circuit bonding lines, and the Touch IC region leads out 576 touch signal integrated circuit bonding lines.

In the solution of the embodiment, the line density of the layer where the source/drain electrode is located and the layer where the gate electrode is located can be reduced by more than 6.67%. Thus, the rate of the short-circuit occurrence of the fanout region can be reduced by about 0.5%.

Figure 6:
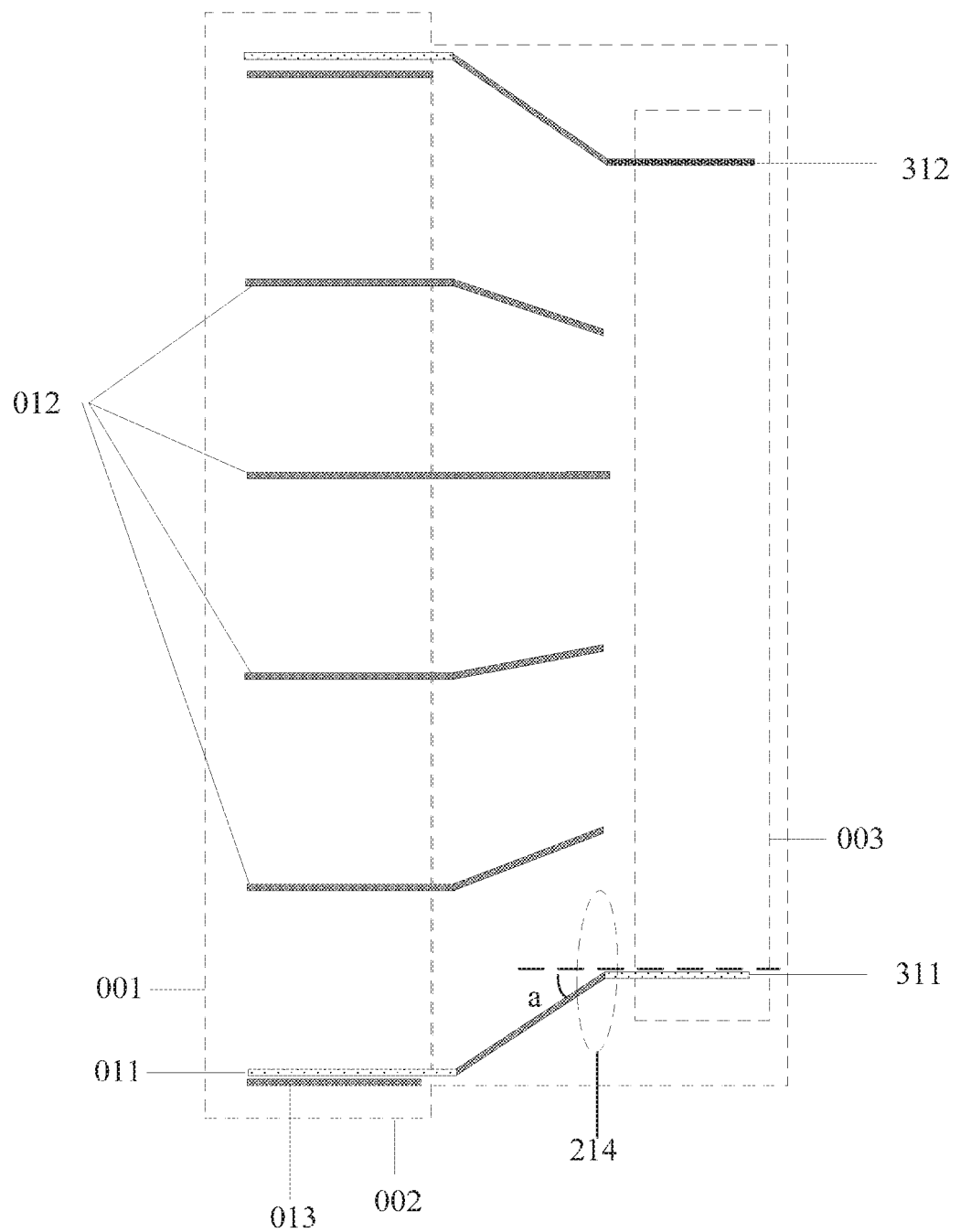
FIG. 6 is a schematic structural view of a display substrate according to an embodiment of the present disclosure.

Since there are inclined lines in the fanout area, the spacing between the lines is small. If a connection hole is provided on a fanout line of a layer where the touch electrode is located (referred to as a "touch electrode layer"), the diameter of the connection hole is generally larger than the line width of the lines. The adjacent lines of the fanout line of the touch electrode layer may be covered. Therefore, it is necessary to appropriately increase the interval between the lines to ensure that there is enough space for the connection holes. Therefore, in other embodiments, as shown in FIG. 6, an angle a at which the data signal fanout line (the first fanout line) is inclined with respect to an extending direction of the data signal line is greater than a preset value, such that an interval between the data signal fanout line and an adjacent line is greater than an aperture of the holes in the second insulating layer. The dotted elliptical area 214 in FIG. 6 illustrates the set area of the connection hole.

The solution of the embodiment of the disclosure is applicable to an in-cell touch panel, such as an in-line Thin Film Transistor LCD (TFT-LCD), and the like.

Based on the same inventive concept, an embodiment of the present disclosure further provides a display device including the display substrate as described in any of the above embodiments.

Figure 7:
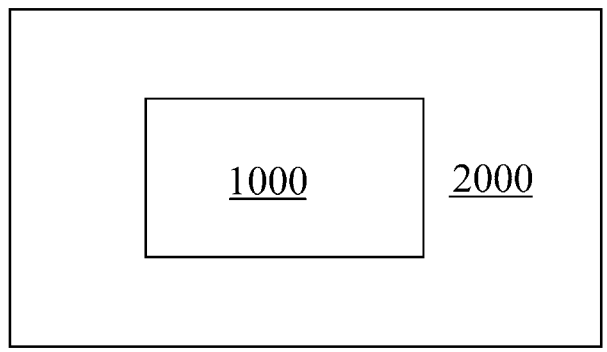
FIG. 7 is a block diagram showing an example embodiment of a display device

FIG. 7 is a block diagram showing an example embodiment of a display device. As shown in FIG. 7, the display device 2000 includes a display substrate 1000. In this example embodiment, display substrate 1000 is a display substrate 1000 as shown in FIGS. 1A-6.

In the display substrate and the display device provided by the embodiment of the disclosure, the data signal fanout lines are disposed on the three layers of the touch electrode layer, the gate electrode layer, and the source/drain electrode layer, thereby reducing the number of the data signal fanout lines in the gate electrode layer and the source/drain electrode (the second fanout line and the third fanout line). Thus, the setting density of the data signal fanout line of the gate electrode layer and the source-drain electrode layer can be reduced. When leading out the data signal lines from the display area, the distance between the obliquely arranged lines is increased. Thus, the risk of short circuit between the fanout lines of the respective layers of the gate electrode layer and the source/drain electrode layer are reduced (the second fanout line and the third fanout line).

It will be apparent that those skilled in the art can make various modifications and variations to the disclosure without departing from the spirit and scope of the disclosure. Thus, it is intended that the present disclosure cover the modifications and modifications of the disclosure.

What is claimed is:

1. A display substrate comprising:
   data signal lines located in a display area of the display substrate; and
   data signal fanout lines in a fanout area adjacent the display area of the display substrate and respectively connected in one-to-one correspondence with the data signal lines, wherein the data signal fanout lines comprise first fanout lines disposed in the same layer with a touch electrode of the display substrate,
   wherein the data signal fanout lines further comprise second fanout lines and third fanout lines, the second fanout lines being disposed in the same layer as a source/drain electrode of the display substrate, and wherein the third fanout lines are disposed in the same layer with a gate electrode of the display substrate.

2. The display substrate according to claim 1, further comprising:
   a first insulating layer between a source/drain electrode and the touch electrode;
   a second insulating layer covering the touch electrode and the first insulating layer;
   a first hole penetrating the first insulating layer and the second insulating layer; and
   a second hole disposed in the second insulating layer, wherein at least one first fanout line is connected to the data signal lines through the first hole and the second hole.

3. The display substrate according to claim 2, further comprising:
   a third hole penetrating the first insulating layer and the second insulating layer; and
   a fourth hole disposed in the second insulating layer, wherein at least one first fanout line is connected to a first bonding line through the third hole and the fourth hole.

4. The display substrate according to claim 3, further comprising:
   a third insulating layer between the source/drain electrode and the gate electrode;
   a fifth hole penetrating through the first insulating layer, the second insulating layer, and the third insulating layer; and a sixth hole disposed in the second insulating layer, wherein at least one first fanout line is connected to a second bonding line through the fifth hole and the sixth hole.

5. The display substrate according to claim 4, further comprising:
   touch signal lines disposed in the display area and in the same layer as the touch electrode; and
   touch signal fanout lines located in the fanout area and respectively connected in one-to-one correspondence to the touch signal lines.

6. The display substrate according to claim 5, wherein the data signal fanout lines and the touch signal fanout lines are spaced apart from each other.

7. The display substrate according to claim 6, wherein an angle at which at least one first fanout line is inclined with respect to an extending direction of the data signal lines is greater than a preset value, such that an interval between the data signal fanout lines and an adjacent line is greater than an aperture of the holes in the second insulating layer.

8. The display substrate according to claim 5, wherein the touch signal lines comprise a dummy touch signal line, and wherein the first fanout line comprises a dummy touch signal fanout line corresponding to the dummy touch signal line.

9. A display device comprising the display substrate according to claim 2.

10. A display device comprising the display substrate according to claim 1.

11. A display substrate comprising:
    data signal lines located in a display area of the display substrate; and
    data signal fanout lines in a fanout area adjacent the display area of the display substrate and respectively connected in one-to-one correspondence with the data signal lines, wherein the data signal fanout lines comprise first fanout lines disposed in the same layer with a touch electrode of the display substrate, second fanout lines, and third fanout lines, the second fanout lines being disposed in the same layer as a source/drain electrode of the display substrate, the third fanout lines being disposed in the same layer with a gate electrode of the display substrate, wherein the display substrate further comprises bonding lines in a bonding area, wherein the bonding area is located on a side of the fanout area far away from the display area, and wherein the bonding lines are connected in one-to-one correspondence with the data signal fanout lines.

12. The display substrate according to claim 11, wherein the bonding lines comprise first bonding lines disposed in the same layer as the source/drain electrode and second bonding lines disposed in the same layer as the gate electrode, and wherein the first fanout lines are connected to at least one of the first bonding lines and the second bonding lines.

13. The display substrate according to claim 12, wherein the second fanout lines are connected to the first bonding lines, and the third fanout lines are connected to the second bond lines.

14. A display device comprising the display substrate according to claim 13.

15. The display substrate according to claim 12, wherein a number of the first fanout lines connected to the first bond lines is equal to a number of the first fanout lines connected to the second bond lines.

16. A display device comprising the display substrate according to claim 15.

17. A display device comprising the display substrate according to claim 12.

18. A display device comprising the display substrate according to claim 11.

* * * * *